US006384759B2

(12) United States Patent
Snyder

(10) Patent No.: US 6,384,759 B2
(45) Date of Patent: May 7, 2002

(54) METHOD AND APPARATUS FOR SAMPLE RATE PRE-AND POST-PROCESSING TO ACHIEVE MAXIMAL CODING GAIN FOR TRANSFORM-BASED AUDIO ENCODING AND DECODING

(75) Inventor: James H. Snyder, North Plainfield, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/773,492

(22) Filed: Feb. 2, 2001

Related U.S. Application Data

(63) Continuation of application No. 09/265,880, filed on Mar. 11, 1999.

(60) Provisional application No. 60/114,719, filed on Dec. 30, 1998.

(51) Int. Cl.[7] .................................. H03M 1/00

(52) U.S. Cl. ..................... 341/123; 395/2.39; 704/205

(58) Field of Search ............................ 341/123, 110, 341/122, 144, 155, 61, 143; 704/205, 500; 395/2.39, 2.14; 348/390

(56) References Cited

U.S. PATENT DOCUMENTS 5,490,233 A * 2/1996 Kovacevic ................. 395/2.39
5,841,473 A * 11/1998 Chui et al. .................. 348/390
5,926,791 A * 7/1999 Ogata et al. ................ 704/500
6,182,031 B1 * 1/2001 Kidder et al. .............. 704/205

* cited by examiner

*Primary Examiner*—Brian Young
*Assistant Examiner*—John B Nguyen
(74) *Attorney, Agent, or Firm*—Oliff & Berridge, PLC

(57) ABSTRACT

The invention relates to a method and apparatus for achieving maximal coding gain for audio transmission. More particularly, at a chosen sample rate and frequency range value, an audio input signal is downsampled to the sample rate, encoded and transmitted at a given bit rate. At the receiving end, the downsampled signal is decoded and upsampled to the original or other suitable sample rate. The upsampled signal is then audibly output. Since resampling ratios using "small" numbers prove to be more computationally efficient, this method and apparatus supports resampling ratios which imply both standard and non-standard sampling ratios in the codec.

28 Claims, 7 Drawing Sheets

METHOD AND APPARATUS FOR SAMPLE RATE PRE-AND POST-PROCESSING TO ACHIEVE MAXIMAL CODING GAIN FOR TRANSFORM-BASED AUDIO ENCODING AND DECODING

This is a continuation of application Ser. No. 09/265,880, filed Mar. 11, 1999.

This non-provisional application claims the benefit of U.S. Provisional Application 60/114,719, filed Dec. 30, 1998, the subject matter of which is incorporated herein by reference.

BACKGROUND OF THE INVENTION

1. Field of Invention

The invention relates to audio signal transmission, and more particularly to varying the sample-rate to improve coding gain for audio signals.

2. Description of Related Art

There are a number of decisions which must be made in setting up an audio compression system. Among the most important variables that affect audio quality during encoding are the sampling rate, bit rate, and the frequencies that will be encoded, such as 20 Hz–20 KHz or some lesser range, for example. For a given level of distortion and a given algorithm, more bits are required to transmit more signal frequencies. Therefore, there is a optimal match between bit rate and frequency range such that if the bit rate is specified, distortion will increase if more frequencies are encoded then is optimal for that bit rate.

Most high-quality audio algorithms, such as MPEG AAC (MPEG Advanced Audio Coder), PAC (Perceptual Audio Coder), MPEG layer3, Dolby AC3 (Advanced Coder 3), and NTT's TwinVQ, encode a fixed number of samples into each frame which then represent a unit of time for a particular algorithm. Each audio frame carries side information. The number of bits needed to encode the side information per frame is roughly constant. This side information imposes a per-frame overhead.

The frame frequency (i.e., the number of frames per second) used by an audio algorithm is proportional to the sampling rate because each frame encodes a constant number of samples.

Decreasing the sampling rate decreases the number of frames-per-second, which in turn decreases the number of bits diverted for overhead, allowing more bits to be used for audio coding. Thus, lowering the sampling rate results in more bits being available for audio coding which results in a higher quality signal as long as sufficient frequency range is preserved.

To a similar end, the statistical properties of music indicate that an optimal frame duration is about 40 ms. For AAC and PAC at sampling rates of 44100 sps (samples per second) (i.e., the CD sample rate) the frame duration is about 23 ms; at 22050 sps, the frame duration is 46 ms.

The lower the sampling rate, the lower the frequency range that can be transmitted, as described by the Nyquist rule, which limits the maximum frequency range to half of the sampling rate. In practical implementations a "guard band" is needed which further lowers the achievable maximum frequency range. For example, for any algorithm (e.g. AAC), at a sampling rate of 22050 sps, the maximum frequency range is 8 to 10 KHz.

Thus, for a given algorithm, and for a given bit rate $b_0$ that is not sufficient for encoding the entire human-audible frequency range in a transparent manner without audible distortion, and for a specified acceptable level of distortion, there is a maximum frequency range $f_0$ that one can encode, and that maximum will be associated with a sample rate $f_{s0}$.

If there were no outside constraints, then one would use $f_{s0}$ as the sampling rate. However, several outside constraints exist. For example, PCs and Macintoshes work mostly at 44100, 22050 and 11025 sps. Some PCs work at one or more of the rates 48000, 32000, 24000, 16000 and 8000 sps, but very few PCs will work at all of these sample rates. In fact, Macintosh audio hardware will not work at all at these latter sample rates, so a user is constrained to a small set of sample rates if he or she want to interact with PCs and an even smaller set of sample rates if one wants to interact transparently with Macs without involving potentially inferior resampling in the PC or Mac.

SUMMARY OF THE INVENTION

The invention relates to a method and apparatus for achieving maximal coding gain for audio coding and reproduction. More particularly, at a chosen sample rate and frequency range value, an audio input signal is transduced, sampled, downsampled to the encoding sample rate, encoded and transmitted at a given bit rate. At the receiving end, the downsampled signal is decoded and upsampled to the original or other suitable sample rate. The upsampled signal is then audibly output.

Resampling using "small-integer" ratios (e.g. 11:8) is computationally more efficient than using arbitrary resampling ratios. This method and apparatus support both arbitrary and small-integer ratio resampling. The use of small-integer resampling frequently implies the use of non-standard sampling rates in the transmitted channel, for example 32073 sps rather than 32000 sps.

These and other features and advantages of this invention are described in or are apparent from the following detailed description of the preferred embodiments.

BRIEF DESCRIPTION OF THE DRAWINGS

The invention will be described with reference to the accompanying drawings, in which like elements are referenced with like numbers, and in which.

DETAILED DESCRIPTION OF PREFERRED EMBODIMENTS

Figure 1:
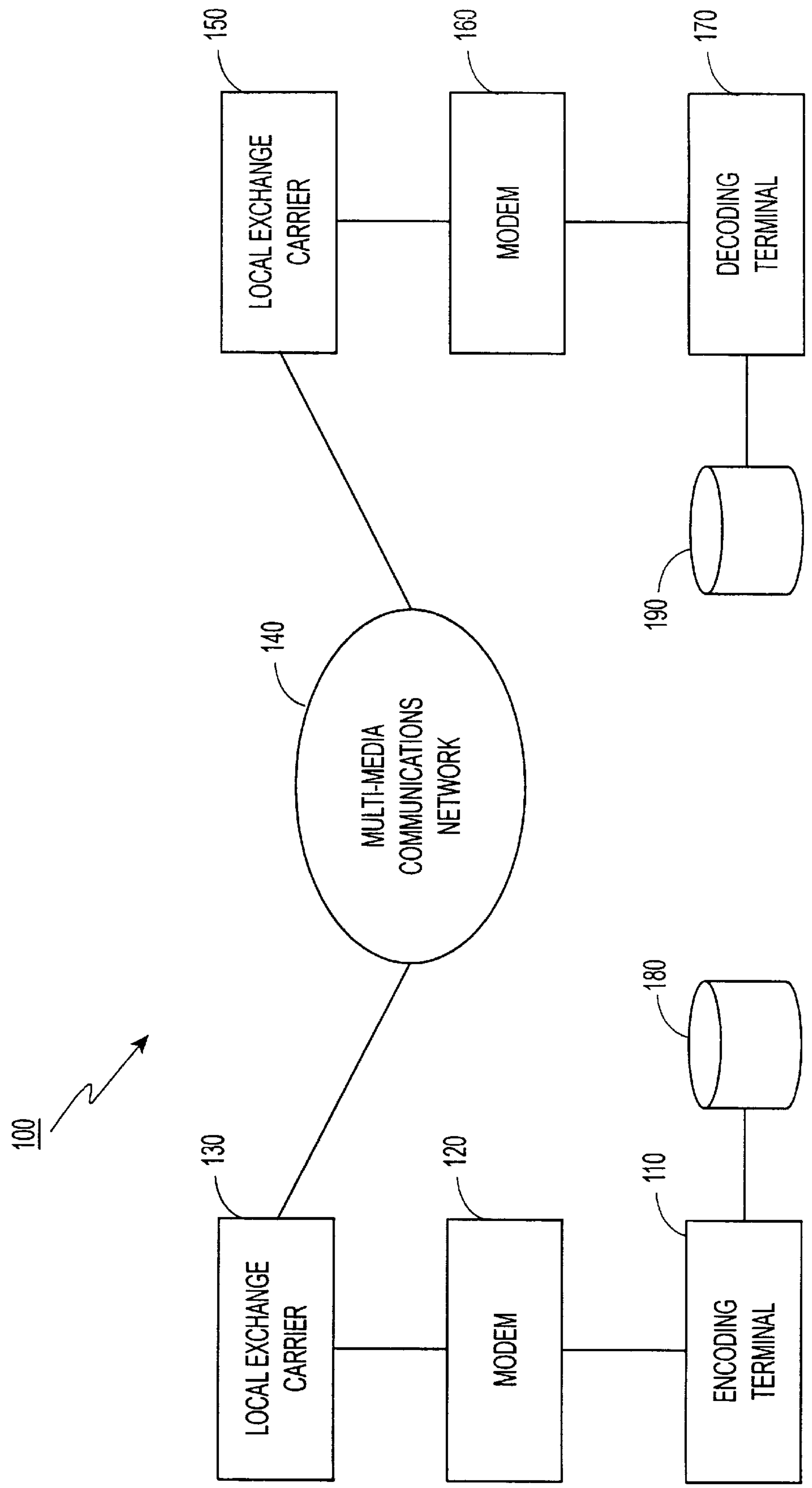
FIG. 1 is an exemplary diagram of an audio transmission system.

FIG. 1 is an exemplary block diagram of an audio transmission system 100 of the invention. An encoding terminal 110 that downsamples and encodes audio signals is connected to a multimedia communications network 140 through modem 120 and local exchange carrier 130. A decoding terminal 170 that receives, decodes and upsamples the audio signals is also connected to the multimedia communications network 140 through modem 160 and local exchange carrier 150. The encoding terminal 110 and decoding terminal 170 include memory units 180 and 190, respectively, for intermediate storage of the compressed audio signal either prior to transmission or after reception of the audio signals, for example.

The multimedia communications network 140 represents any combination of existing communications networks, such as a telephone network, Internet, intranet, etc.

The modem devices 120, 160 may be ethernet interfaces, cable modems, ISDN modems, ADSL modems, or any other interface circuit intended to connect two networks or a network and a digital computing apparatus. The modem devices 120, 160 may contain a conventional RJ-11 outlet for connection to computer modem, facsimiles, printers or other equipment. The modem devices 120 and 160 may also be equipped with universal serial bus (USB), integrated system digital network (ISDN) or other standard data interfaces, as will be appreciated by the person skilled in the art. However, other similar devices may be used to permit sharing of large bandwidths over media already installed.

Encoding terminal 110 and decoding terminal 170 may be any pair of devices that receive and send audio signals according to the invention through the multimedia communications network 140 via modems 120 and 160. The encoding terminal 110 and decoding terminal 170 may represent such devices as a personal computer (PC), telephone, television, facsimile, or any other device capable of sending and receiving audio signals. It may be appreciated that the encoding terminal 110 and decoding terminal 170 may include software and/or hardware for performing the encoding and decoding functions, and further that the encoding and decoding terminals may be different types of devices.

It may further be appreciated that while the encoding terminal 110 and the decoding terminal 170 include memory units 180 and 190, respectively, for intermediate storage of the compressed audio signal, the compressed audio signal may be intermediately stored in one or more other intermediate storage devices located throughout the audio transmission system 100, such as between the modem 120,160 and the local exchange carrier 130,150, or in the multi-media communications network 140.

In providing a more detailed discussion of the encoding and decoding of audio signals, a discussion of conventional systems is set forth in FIGS. 2–6 to better to explain the features and advantages of the present invention.

Figure 2:
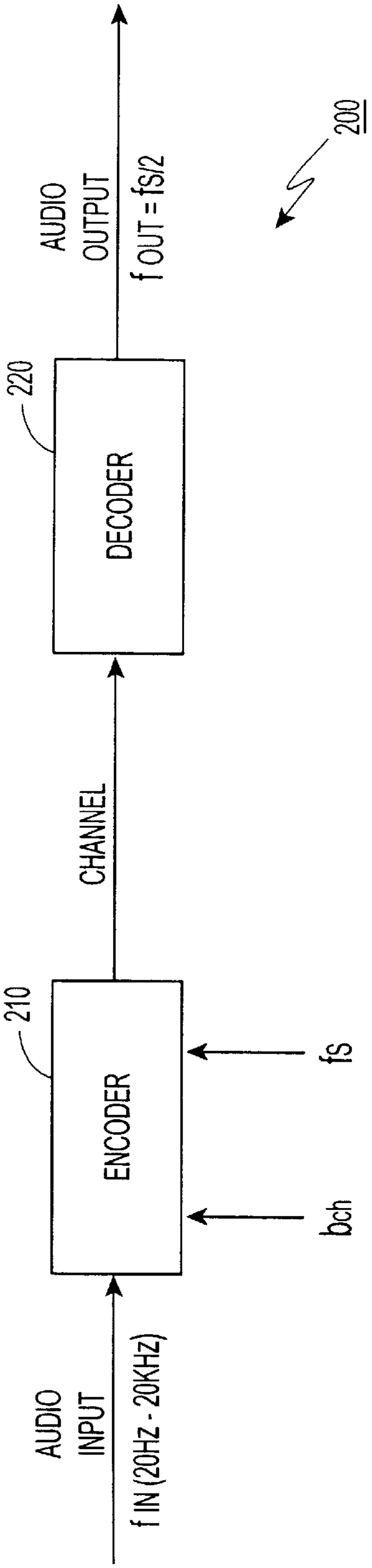
FIG. 2 PRIOR ART
FIG. 2 is a block diagram of a generic audio encoding/decoding system.

FIG. 2 shows a generic audio encoding/decoding system 200 operating at a bit rate which is sufficient to encode all of the frequencies in the input signal. An encoder 210 located within a computing unit, for example a PC, receives an audio input signal with frequency range $f_{in}$ (typically spanning the range of 20 Hz–20 KHz) and encodes the signal for transmission across a communications channel.

The input signal may either be analog or digital. If the input signal is analog, the encoder 210 will include an analog-to-digital conversion apparatus. However, the input signal may already be digitized, such as stored signals retrieved from an audio compact disc, for example.

A decoder 220, located within another PC for example, receives and decodes the transmitted audio signal to produce an audio output $f_{out}$ which is less than $f_{in}$ and less than $f_s/2$. The encoder/decoder system 200 in this example has no other specified bandwidth limit and the distortion level is unspecified. If the bit rate $b_{ch}$ and the sample rate $f_s$ are high enough (for the encoding algorithm) then the reproduced audio will be indistinguishable from the original. If either is too low, then the audio will be perceived as degraded.

Figure 3:
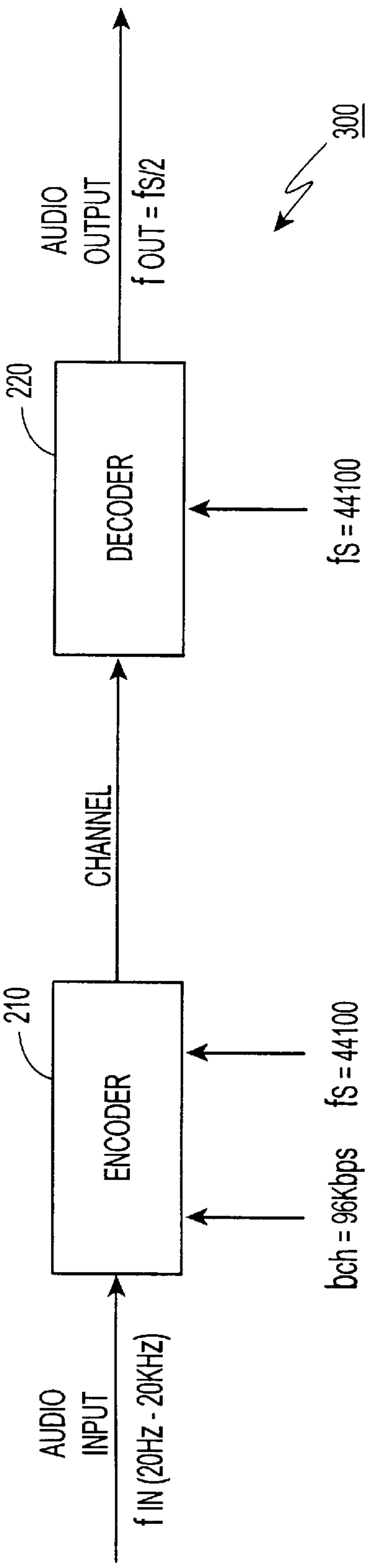
FIG. 3 PRIOR ART
FIG. 3 is a block diagram of a generic frame-based audio encoding/decoding which operates at a bit rate too low to support the full audio bandwidth implied by the sampling rate (thru Nyquist)

FIG. 3 shows a generic frame-based audio encoding/decoding system 300 operating at a high sampling rate, such as 44100 sps. The audio encoder/decoder system of FIG. 3 is similar to that of FIG. 2, but the sampling rate of 44100 sps used for encoding is too high to permit transparent audio reproduction of the full human-audible frequency range (20 Hz–20 KHz) at the specified bit rate of 96 Kbps, so a degradation in audio signal quality is perceived. In this example, as well as in the examples in FIGS. 4–6, the encoder is operating at 96 Kbps and 44100 sps, although the same principles apply at other sampling rates and other bit rates.

Figure 4:
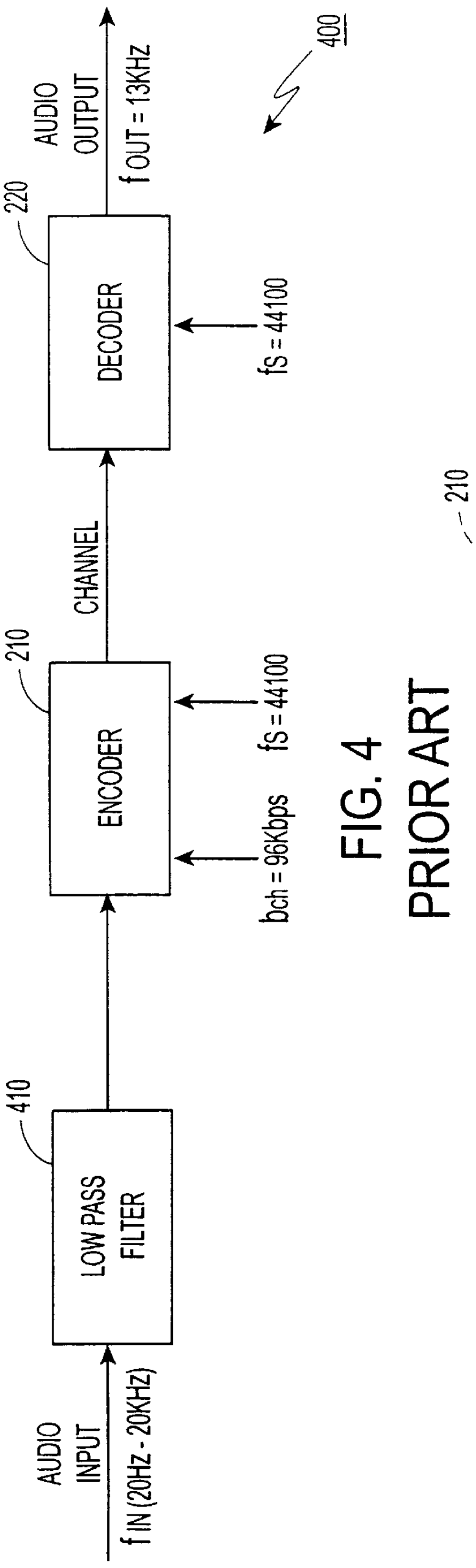
FIG. 4 PRIOR ART
FIG. 4 is a block diagram of a generic frame-based audio encoding/decoding system using a low-pass filter.
Figure 5:
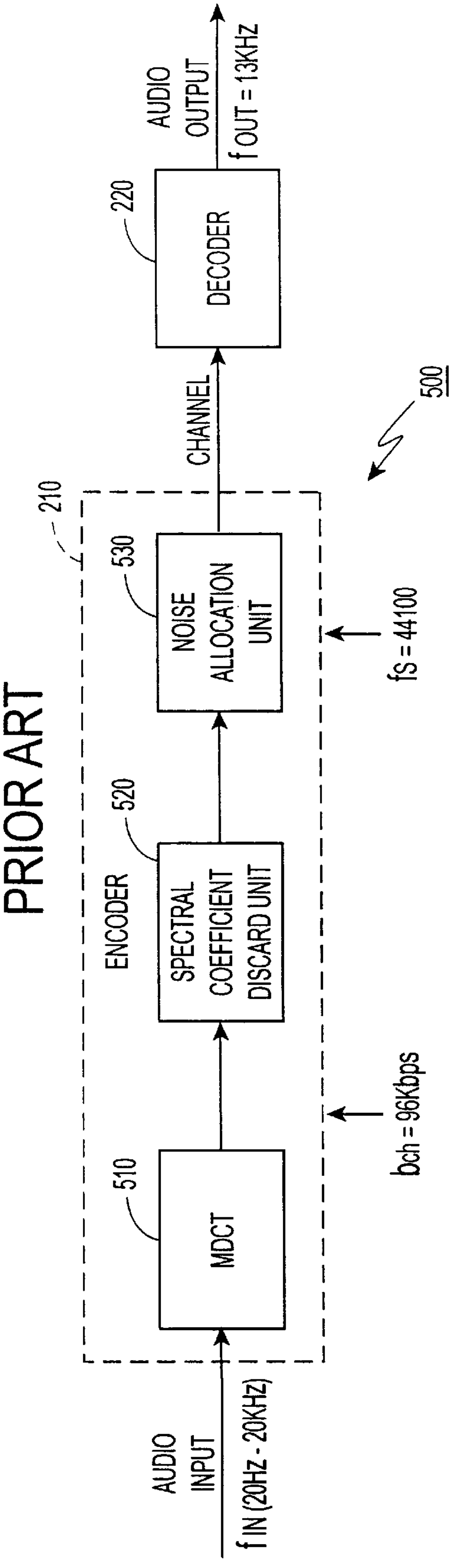
FIG. 5 PRIOR ART
FIG. 5 is a block diagram of a generic frame-based audio encoder/decoder that discards spectral coefficients.
Figure 6:
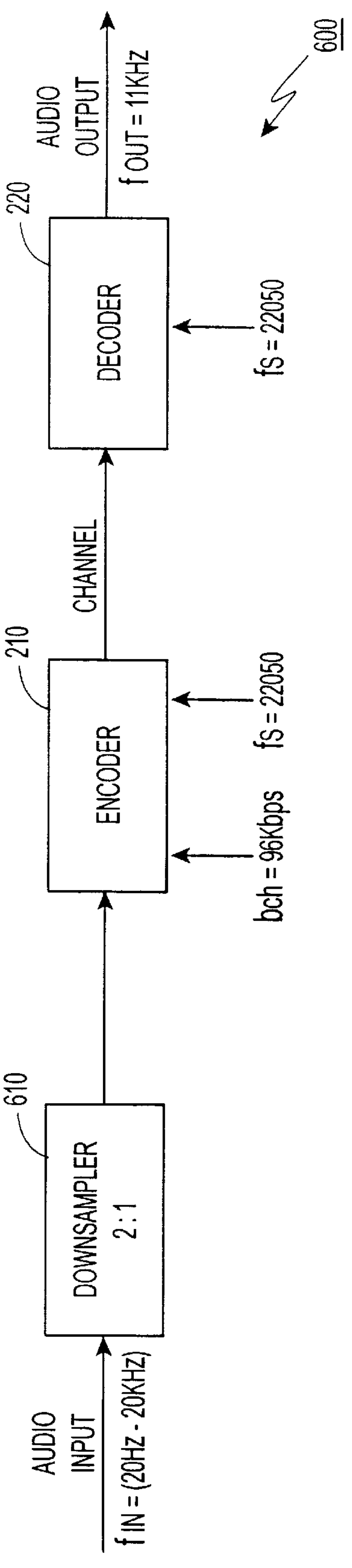
FIG. 6 PRIOR ART
FIG. 6 is a generic frame-based audio encoding/decoding system that downsamples the audio input.

One way to improve reproduced audio signal quality when the bit rate is too low to support the full frequency range of the input is to encode less than the full frequency range. By way of reference, for a production quality AAC codec, best reproduced signal quality at 96 Kbps and 44100 sps occurs for a signal bandwidth of about 13 KHz. FIGS. 4–6 show various ways to decrease the audio frequency range.

FIG. 4 shows a generic frame-based audio encoding/decoding system 400 operating at a high sampling rate that uses a low pass filter 410 to limit the frequency range that is encoded. In many cases, a lower sampling rate would allow a wider frequency range or alternatively a higher quality audio signal (because of frame overhead and music statistics). Consequently, the system in FIG. 4 is sub-optimal.

FIG. 5 shows a generic frame-based audio encoding/decoding system 500 that operates at a high sampling rate (44100 sps) that discards spectral coefficients in the input signal to limit the frequency range that is encoded and transmitted. This operation is similar but not identical to that of the low pass filter 410 discussed above.

The audio input signal is input to the Modified Discrete Cosine Transform (MDCT) 510 (or other time-to-frequency domain transform) and the spectral coefficients are discarded by the spectral coefficient discard unit 520. The signal is then input to a noise allocation unit 530 (which computes the masking thresholds for the audio frame and quantizes the spectral coefficients according to the thresholds) which emits the compressed signal. The compressed signal is then transmitted to the decoder 220 of another computing unit (for example, another PC, or a portable audio device similar to the Diamond Rio MP3 player) for decoding and output.

FIG. 6 shows a generic frame-based audio encoding/decoding system 600 that downsamples the audio input signal to limit the frequency range that is encoded and transmitted. (Resamplers typically incorporate frequency-limiting filters.) The audio input signal is downsampled by the downsampler 610 at a 2:1 ratio and is then input into encoder 210 for encoding. The signal is then transmitted across a communication channel to the decoder 220 at the receiving PC that plays out the audio signal at the downsampled rate. This will generally be suboptimal because the decoder 220 must operate at a submultiple of 44100 sps. In this example, the suboptimal would be 2:1 to 22050, which is not the rate that provides optimal frequency response.

Figure 7:
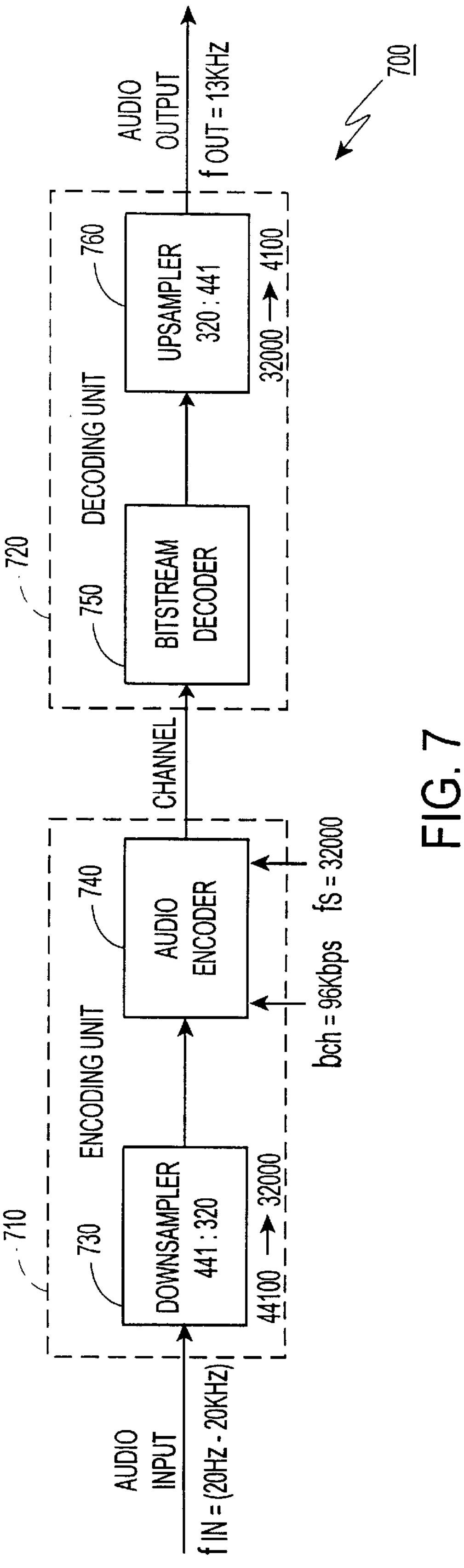
FIG. 7 is a block diagram of a frame-based audio encoding/decoding system according to the invention.

FIG. 7 shows the encoding/decoding system 700 of the invention. The audio encoding/decoding system 700 includes an optimal triplet of sample rate $f_{s0}$ (in this case 32 Ksps), bit rate 96 Kbps, and the maximum supportable frequency range $f_0$ which at 96 Kbps/32 Ksps is about 13 kHz. The optimal triplet could be determined in a number of ways, e.g. algorithmically or by searching a table. The analog signal (or a digitized version of the analog signal) is input to the encoding unit 710 of a PC, for example, where the signal is downsampled by downsampler 730 from 44100 to 32000 and encoded by the audio encoder 740. The encoded audio signal is then transmitted across a communications channel, through a modem, for example, at a given bit rate of 96 Kbps to another PC for output.

At the receiving PC, the received signal is input to a decoding unit 720, where a bit stream decoder 750 decodes the downsampled signal. The decoded signal is then input to the upsampler 760 which upsamples the signal to the original or other suitable sample rate. An audio output is then produced with a frequency range $f_{out}$ of about 13 kHz. Note that in the example of FIG. 7, 44100 sps and 32000 sps are standard AAC rates.

As discussed above in reference to FIG. 1, the encoding unit 710 and the decoding unit 720 may include memory units for intermediate storage of the compressed audio signal either prior to transmission or after reception of the audio signals, for example.

It may be the case that the codec (for example, AAC) is specified at a set of standard rates; and that $f_{s0}$ does not match one of these standard rates. However many codecs (such as AAC) can be modified to run at an arbitrary sample rate, and although the resulting encoding unit 710 will generate AAC bit streams that will not reproduce audio accurately unless the decoding unit 720 incorporates this invention, the perceived quality of the reproduced audio signal will be better for the bit stream that uses the non-standard rate than for a bit stream that uses any standard rate.

Figure 8:
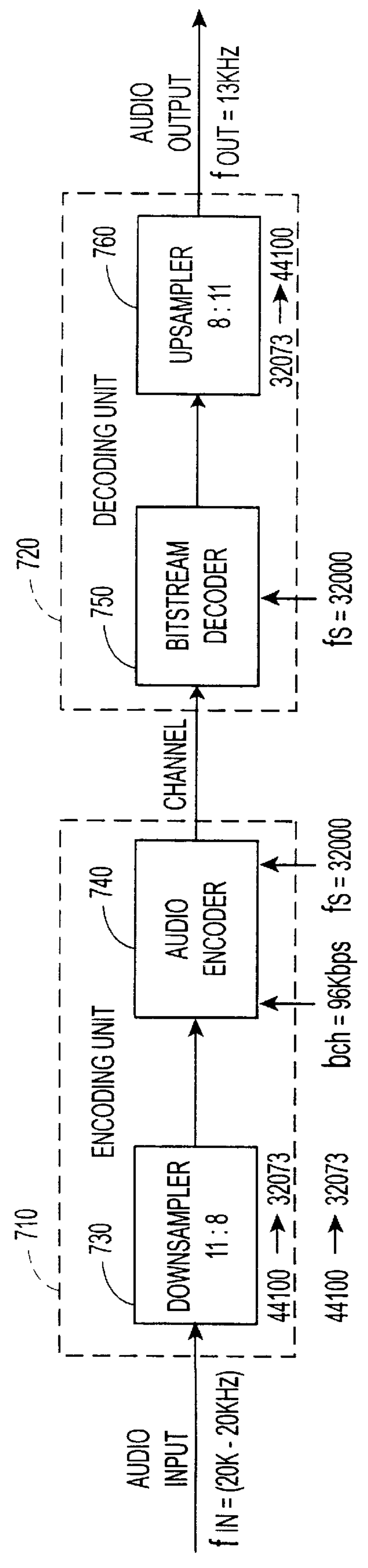
FIG. 8 is a block diagram of a frame-based audio encoding/decoding system of the invention utilizing a non-standard downsampling ratio.

For example, as shown in FIG. 8, the downsampling process used in FIG. 7 may be more computationally efficient when the downsampling factor is the ratio of two small numbers. Consider the case where it is desired to downsample from the standard rate of 44100 sps to the standard rate of 32000 sps. Neither 441 nor 320 (the smallest integers which preserve the 44100:32000 ratio) qualify as a small integer in this context. If a ratio of 11:8 is used, which is equivalent to the ratio of 44000:32000, we can downsample to a comparable intermediate sample rate (32073 sps) in a computationally efficient way, without degrading significantly either frequency response or distortion levels from the optimal sample rate of 32000 sps.

Accordingly, as shown in FIG. 8, the process is the same as that in FIG. 7 but 32073 sps is used as the intermediate sampling frequency. 32073 sps is sufficiently close to an AAC standard rate that audio signals can be encoded using the parameters for a standard AAC rate.

When the intermediate sampling rate is close to a codec standard rate, the bit stream header, which generally carries information about the sampling rate at which the audio was encoded, can indicate the nearby standard rate. This is generally advantageous because it allows a conventional decoder (i.e. one which does not incorporate the current invention) to decode the bit stream and reproduce the audio, even though the audio reproduction strictly speaking is not accurate. In this case (32073 sps sampling rate rather than the 32000 sps indicated in the bit stream header), there will be a pitch shift in the audio reproduced by the conventional decoder. This may be acceptable for some applications but not for others.

However, the invention is still useful when the resulting sampling rate is not close to a standard rate, as long as it is possible to modify the audio encoding unit 710 so that it supports the non-standard rate. For example, with a down-sample ratio of 9:8 one obtains a sampling rate of 39200 sps, which with a production AAC codec would support a frequency range as high as 15–17 KHz at a bit rate of 112 Kbps at an acceptable level of distortion. Since the down-sample factor is again the ratio of two small numbers, the resampling process would again be computationally efficient.

It may be advantageous to indicate to the decoding unit 720 what resampling ratio has been used to encode the audio, since otherwise the codec system (FIGS. 7 & 8) must operate at a fixed resampling ratio. As a particular embodiment of the method and apparatus of this invention, the resampling ratio is incorporated into the bit stream within a reserved bit field of the standard header. As an alternative embodiment, the resampling ratio can be incorporated as side channel information. In a specific example, AAC permits "data packets" to be incorporated in the bit stream. These data packets are ignored by a standard AAC codec. The resampling ratio can be specified in a data packet, possibly along with other information.

While the invention above has been discussed from the point of view of supporting the maximum frequency range for a given bit rate and level of distortion, there are two alternative ways of looking at this problem. Rather than support maximum frequency at a given bit rate, a frequency range and a given distortion level at a minimum bit rate may be supported. Alternatively, a given frequency range at a given bit rate may be supported to achieve the lowest distortion levels. That is, there are three interrelated variables: bit rate, distortion level, and frequency support. One can fix any two variables and use the above embodiment to achieve the best possible results for the remaining variable.

Figure 9:
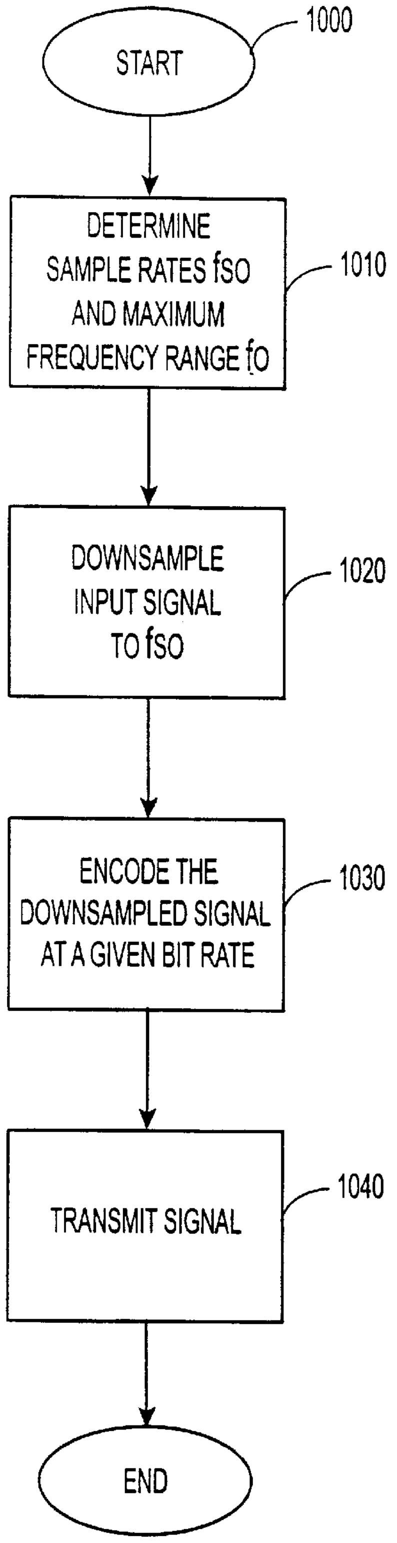
FIG. 9 is a flowchart of the encoding portion of the invention.

FIG. 9 is a flowchart of the encoding process according to the invention. Process begins at step 1000 and proceeds to step 1010 where the sample rate $f_{s0}$ and maximum frequency range $f_0$ are determined as an optimal pair either algorithmically or by searching a table, for example. In step 1020, an input signal is received by the encoding unit 710 and is downsampled by downsampler 730 to $f_{s0}$. The process proceeds to step 1030 where the signal is encoded by the audio encoder 740. The process then proceeds to step 1040 where the signal (along with a header, data packet, etc. that includes the downsampling information), is transmitted at a given bit rate from a modem across a communication channel. The encoding process then goes to step 1050 and ends.

Figure 10:
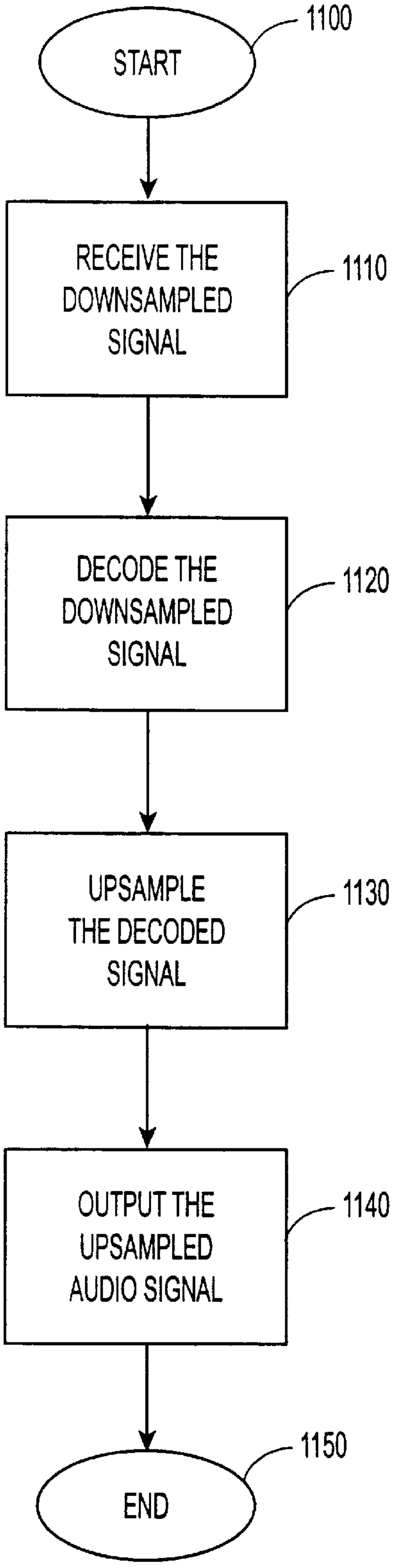
FIG. 10 is a flowchart of the decoding portion of the invention.

FIG. 10 is a flowchart of the decoding process. Process begins at step 1100 and proceeds to step 1110 where the downsampled signal (along with a header, data packet, etc. that includes the downsampling information) is received by another PC's (for example) decoding unit 720. The process proceeds to step 1120 where the downsampled signal is decoded by the bit stream decoder 750 and then upsampled at step 1130 by the upsampler 760 at a ratio corresponding to the downsampling ratio included with the received downsampled signal, for example. The upsampled signal is then output in step 1140. The process then goes to step 1150 and ends.

While this invention has been described in conjunction with specific embodiments thereof, it is evident that many alternatives, modifications, and variations will be apparent to those skilled in the art. Accordingly, preferred embodiments of the invention is set forth herein are intended to be illustrative, not limiting. Various changes may be made without departing from the spirit and scope of the invention.

What is claimed is:

1. A method for preparing audio signals for encoding and transmitting in a multi-media communication network, comprising:

receiving an input audio signal;

downsampling the input audio signal at a first communications device from an original sampling rate to a predetermined intermediate sampling rate, the downsampled signal including a resampling ratio, resampling the downsampled signal to a predetermined sampling rate , based on the resampling ratio, for subsequent output.

2. The method of claim 1, further comprising:

storing the encoded signal.

3. The method of claim 1, wherein the audio signal is downsampled to a standard sampling rate.

4. The method of claim 1, wherein the audio signal is downsampled to a non-standard sampling rate.

5. The method of claim 1, wherein the audio signal is upsampled to a standard sampling rate.

6. The method of claim 1, wherein the audio signal is upsampled to a non-standard sampling rate.

7. The method of claim 1, further comprising determining the sampling rate and a maximum frequency range algorithmically or according to a table.

8. The method of claim 1, wherein the transmitting includes transmitting at least one of a given bit rate, a frequency range, and a desired distortion level that is predetermined.

9. The method of claim 1, further comprising:

creating a header for the encoded signal that includes a downsampling ratio;

transmitting the header with the encoded signal to the second communications device.

10. The method of claim 1, wherein the input audio signal is downsampled by using computationally efficient integers for downsampling.

11. The method of claim 1, wherein resampling the downsampled audio signal comprises using computationally efficient small integers for resampling.

12. The method of claim 1, wherein the input audio signal is a baseboard input signal.

13. The method of claim 1, wherein the downsampled signal includes side channel information that includes the resampling ratio.

14. The method of claim 1, wherein the downsampled signal has a bit stream that includes at least one data packet that includes the resampling ratio.

15. An apparatus for resampling audio signals and transmitting the audio signals in a multi-media communications network, comprising:

a first terminal including a downsampler that receives an input audio signal and downsamples the input audio signal from an original sampling rate to a predetermined intermediate sampling rate, the downsampled signal including a resampling ratio; and a second terminal including a resampler that resamples the downsampled signal to a predetermined sampling rate, based on the resampling ratio, for subsequent output.

16. The apparatus of claim 15, further comprising:

a memory for storing the encoded signal.

17. The apparatus of claim 15, wherein the audio signal is downsampled to a standard sampling rate.

18. The apparatus of claim 15, wherein the audio signal is downsampled to a non-standard sampling rate.

19. The apparatus of claim 15, wherein the audio signal is upsampled to a standard sampling rate.

20. The apparatus of claim 15, wherein the audio signal is upsampled to a non-standard sampling rate.

21. The apparatus of claim 15, further comprising a determination device that determines the sampling rate and a maximum frequency range algorithmically or according to a table.

22. The apparatus of claim 15, further comprising a transmitter that transmits the audio signal from the first terminal to the second terminal at a bit rate, in a frequency range, and at a distortion level, at least one of the bit rate, the frequency range, and the distortion level being fixed.

23. The apparatus of claim 15, further comprising an encoder that creates a header for the downsampled signal, and a transmitter that transmits the header with the downsampled signal.

24. The apparatus of claim 15, wherein the downsampler uses computationally efficient small integers for downsampling.

25. The apparatus of claim 15, wherein the resampler uses computationally efficient small integers for resampling.

26. The apparatus of claim 15, wherein the input audio signal is a baseboard input signal.

27. The apparatus of claim 15, wherein the downsampled signal includes side channel information that includes the resampling ratio.

28. The apparatus of claim 15, wherein the downsampled signal includes a bit stream that includes at least one data package that includes the resampling ratio.

* * * * *